US008982638B2

(12) United States Patent
Baik et al.

(10) Patent No.: US 8,982,638 B2
(45) Date of Patent: Mar. 17, 2015

(54) SEMICONDUCTOR MEMORY DEVICE AND METHOD OF OPERATING THE SAME

(71) Applicant: SK Hynix Inc., Gyeonggi-do (KR)

(72) Inventors: Seung Hwan Baik, Gyeonggi-do (KR); Gyu Seog Cho, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/053,174

(22) Filed: Oct. 14, 2013

(65) Prior Publication Data

US 2014/0369134 A1 Dec. 18, 2014

(30) Foreign Application Priority Data

Jun. 12, 2013 (KR) .......................... 10-2013-0067299

(51) Int. Cl.
*G11C 16/34* (2006.01)
*G11C 16/30* (2006.01)
*G11C 16/10* (2006.01)
*G11C 16/04* (2006.01)
G11C 16/24 (2006.01)

(52) U.S. Cl.
CPC ............ *G11C 16/3459* (2013.01); *G11C 16/24* (2013.01); *G11C 16/10* (2013.01); *G11C 16/3481* (2013.01); *G11C 16/3454* (2013.01); *G11C 16/0483* (2013.01); *G11C 16/30* (2013.01)

USPC ............ 365/185.22; 365/185.17; 365/185.18; 365/185.19; 365/185.23; 365/185.28

(58) Field of Classification Search
CPC .......... G11C 16/3459; G11C 16/0483; G11C 16/3481; G11C 16/30; G11C 16/10; G11C 16/24; G11C 16/3454
USPC .............. 365/185.18, 185.19, 185.23, 185.28
See application file for complete search history.

(56) References Cited

U.S. PATENT DOCUMENTS

2011/0158000 A1* 6/2011 Cho et al. ................. 365/185.22
2012/0106260 A1* 5/2012 Aritome et al. .......... 365/185.22
2012/0170366 A1* 7/2012 Kim et al. ................. 365/185.03

FOREIGN PATENT DOCUMENTS

KR 1020130139598 12/2013

* cited by examiner

*Primary Examiner* — Ly D Pham
(74) *Attorney, Agent, or Firm* — IP & T Group LLP

(57) ABSTRACT

A semiconductor memory device and a method of operating the same perform a program loop, including a program operation and a program verification operation based on a sub-verification voltage smaller than a target verification voltage and the target verification voltage, to the memory cells until a threshold voltage of the memory cells is greater than the target verification voltage. A positive voltage, supplied to the bit line of the memory cell of which the threshold voltage is higher than the sub-verification voltage, is increased whenever the program operation is performed, and thus a threshold voltage distribution of the memory cells may be improved.

17 Claims, 7 Drawing Sheets

SEMICONDUCTOR MEMORY DEVICE AND METHOD OF OPERATING THE SAME

CROSS-REFERENCE TO RELATED APPLICATION

The present application claims priority of Korean patent application number 10-2013-0067299, filed on Jun. 12, 2013, the entire disclosure of which is incorporated herein by reference in its entirety.

BACKGROUND

1. Field of Invention

Exemplary embodiments of the present invention relate to an electronic device, and more particularly, to a semiconductor memory device and a method of operating the same.

2. Description of Related Art

A semiconductor memory device may be divided into a volatile memory device or a non-volatile memory device.

The volatile memory device may lose data stored therein if supplying of a power is stopped, and may perform a read/write operation at a high speed. Meanwhile, the non-volatile memory device may retain the stored data even when the power is not supplied, but tends to have a lower speed than the volatile memory device in the read/write operation. Accordingly, the non-volatile memory device is used to store data to be maintained irrespective of supplying of the power. The non-volatile memory device may include a read only memory (ROM), a mask ROM (MROM), a programmable ROM (PROM), an electrically programmable ROM (EPROM), an electrically erasable and programmable ROM (EEPROM), a flash memory, a phase-change random access memory (PRAM), a magnetic RAM (MRAM), a resistive RAM (RRAM), a ferroelectric RAM (FRAM), etc. There are two main types of the flash memory device: a NOR-type flash memory and a NAND-type flash memory.

A flash memory has an advantage of the RAM for being programmable and erasable data and an advantage of the ROM for maintaining the stored data even when the power is blocked. The flash memory is widely used as a storage medium of a portable electronic device such as a digital camera, a personal digital assistant (PDA) and an MP3 player.

Reliability of data of the semiconductor memory device, for example, the flash memory, may be deteriorated due to various causes.

Accordingly, a semiconductor memory device with high reliability of data is in demand.

BRIEF SUMMARY

Various embodiments of the present invention directed to a semiconductor memory device for improving threshold voltage distribution of memory cells to achieve high reliability of data, and a method of operating the same.

A semiconductor memory device according to an embodiment of the present invention may include memory cells, and a peripheral circuit suitable for performing a program loop, including a program operation and a program verification operation based on a sub-verification voltage, which is smaller than a target verification voltage, and the target verification voltage, to the memory cells until a threshold voltage of the memory cells is greater than the target verification voltage. Here, the peripheral circuit increases a positive voltage, supplied to a bit line of a memory cell of which a threshold voltage is higher than the sub-verification voltage, whenever the program operation is performed.

The peripheral circuit includes page buffers coupled to the bit line. Each of the page buffers may include a first sub-register suitable for supplying a first positive voltage to the bit line according to stored data if the threshold voltage of the memory cell is higher than the sub-verification voltage, in a first program operation; and a second sub-register suitable for supplying a second positive voltage that is higher than the first positive voltage to the bit line according to the data transmitted from the first sub-register, in a second program operation performed after the first program operation.

A method of operating a semiconductor memory device according to an embodiment of the present invention may include performing a program loop, including a program operation and a program verification operation based on a sub-verification voltage, which is smaller than a target verification voltage, and the target verification voltage, to the memory cells until a threshold voltage of the memory cells is greater than the target verification voltage. Here, a positive voltage that is smaller than a program inhibition voltage is supplied to a bit line of a memory cell of which a threshold voltage is higher than the sub-verification voltage and is smaller than the target verification voltage, in the program operation, and the positive voltage is increased whenever the program operation is performed, after the threshold voltage of the memory cell is higher than the sub-verification voltage.

The increasing of the positive voltage when the program operation is performed may include supplying a first positive voltage to the bit line according to data stored in a first sub-register coupled to the bit line in a first program operation, if the threshold voltage of the memory cell is higher than the sub-verification voltage, and supplying a second positive voltage that is higher than the first positive voltage to the bit line according to data transmitted from the first sub-register to a second sub-register coupled to the bit line, in a second program operation performed after the first program operation.

A semiconductor memory device and a method of operating the same may perform a program loop, including a program operation and a program verification operation based on a sub-verification voltage, which is smaller than a target verification voltage, and the target verification voltage, until a threshold voltage of the memory cell is greater than the target verification voltage. In the program operation, a positive voltage supplied to a bit line of a memory cell of which a threshold voltage is higher than the sub-verification voltage increases whenever the program operation is performed, and thus a threshold voltage distribution of the memory cells may be improved. Accordingly, reliability of data of the semiconductor memory device may be enhanced.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Figure 1:
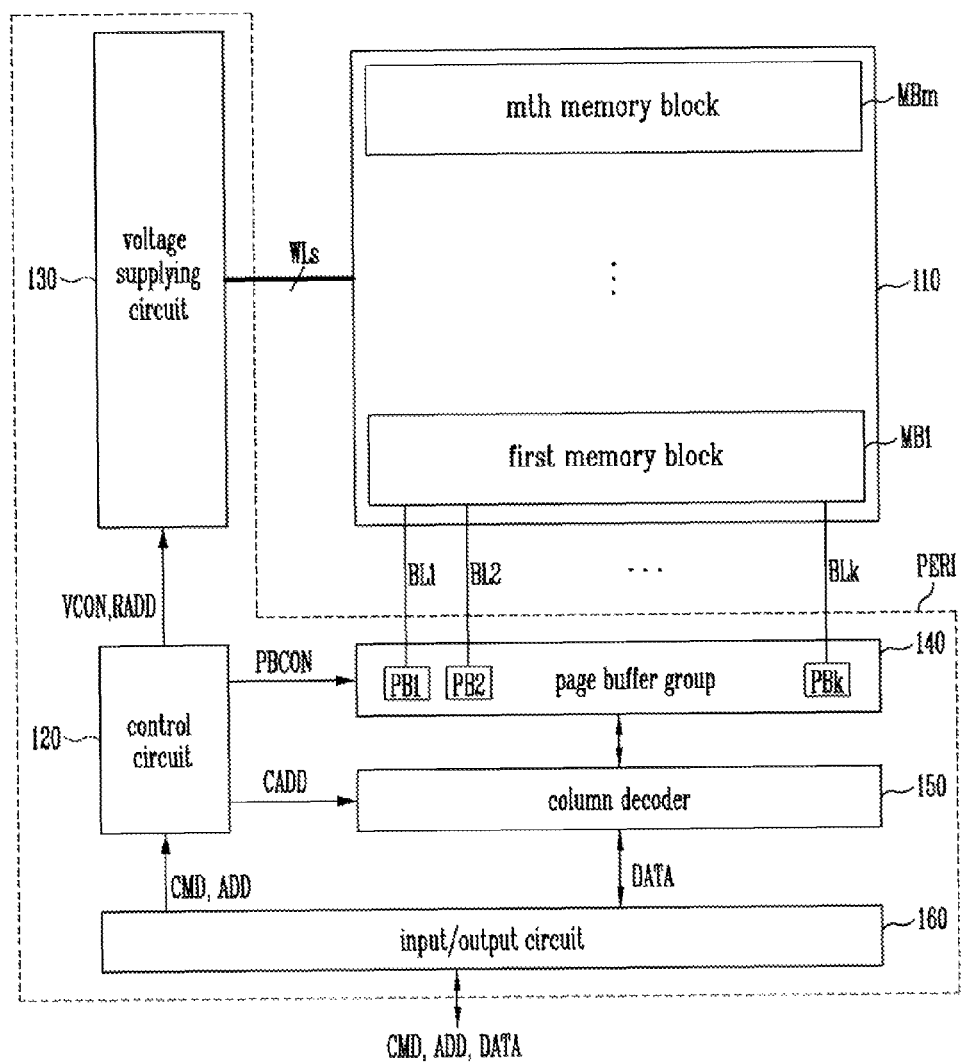
FIG. 1 is a block diagram illustrating a semiconductor memory device according to an embodiment of the present invention.

Hereinafter, the preferred embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 2:
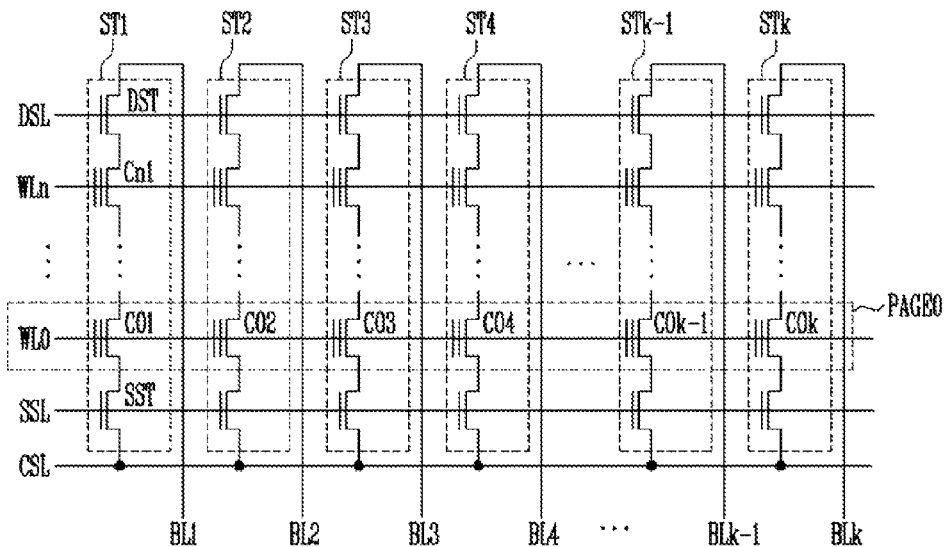
FIG. 2 is a detailed diagram illustrating a memory block shown in FIG. 1.

FIG. 1 is a block diagram illustrating a semiconductor memory device according to an embodiment of the present invention. FIG. 2 is a detailed diagram illustrating a memory block shown in FIG. 1.

The semiconductor memory device may include a memory array 110 having a first to an mth memory blocks MB1~MBm and a peripheral circuit PERI. The peripheral circuit PERI performs a program loop that includes a program operation and a program verification operation based on a sub-verification voltage, which is smaller than a target verification voltage, and the target verification voltage until a threshold voltage of memory cells in a selected page of the memory blocks MB1~MBm is greater than the target verification voltage. The peripheral circuit PERI increases a positive voltage supplied to a bit line of a memory cell of which a threshold voltage is higher than the sub-verification voltage whenever the program operation is performed. The peripheral circuit PERI may include a control circuit 120, a voltage supplying circuit 130, a page buffer group 140, a column decoder 150 and an input/output circuit 160.

In FIG. 2, each of the memory blocks includes strings ST1~STk coupled between bit lines BL1~BLk and a common source line CSL. The strings ST1~STk are respectively coupled to the bit lines BL1~BLk, and are coupled in common to the common source line CSL. Each of the strings, e.g., ST1, may include a source select transistor SST, memory cells C01 to Cn1, and a drain select transistor DST. A source of the source select transistor SST is coupled to the common source line CSL, and a drain of the drain select transistor DST is coupled to the bit line BL1. The memory cells C01 to Cn1 are coupled in series between the select transistors SST and DST. A gate of the source select transistor SST is coupled to a source select line SSL, gates of the memory cells C01 to Cn1 are respectively coupled to word lines WL0 to WLn, and a gate of the drain select transistor DST is coupled to a drain select line DSL.

Memory cells in a memory block of an NAND flash memory device may form a physical page or a logical page. For example, memory cells C01~C0$k$ coupled to one word line, e.g., WL0, form one physical page PAGE0. The page may be a fundamental unit of a program operation or a read operation. Hereinafter, it is assumed that the memory cells coupled to one word line form the physical page.

Referring again to FIGS. 1 and 2, the control circuit 120 outputs a voltage control signal VCON for generating voltages needed for performing the program operation and the program verification operation based on a command signal CMD inputted from an external device through the input/output circuit 160, and outputs a PB control signal PBCON for controlling page buffers PB1~PBk in the page buffer group 140 according to a kind of an operation. An operation of controlling the page buffer group 140 through the control circuit 120 will be described below. The control circuit 120 outputs a row address signal RADD and a column address signal CADD based on an address signal ADD inputted from an external device through the input/output circuit 160.

The voltage supplying circuit 130 supplies operation voltages needed for the program operation and the program verification operation of memory cells to local lines, including the drain select line DSL, the word lines WL0~WLn and the source select line SSL, of a selected memory block based on the voltage control signal VCON of the control circuit 120. The voltage supplying circuit 130 may include a voltage generation circuit and a row decoder.

The voltage generation circuit outputs the operation voltages needed for the program operation and the program verification operation of the memory cells to global lines based on the voltage control signal VCON of the control circuit 120. For example, to perform the program operation, the voltage generation circuit outputs a program voltage to be supplied to the memory cells of the selected page and a pass voltage to be supplied to unselected memory cells to the global lines.

The row decoder couples the global lines to the local lines DSL, WL0~WLn and SSL, to deliver the operation voltages outputted from the global lines to the local lines DSL, WL0~WLn and SSL of the selected memory block in the memory array 110 based on the row address signal RADD of the control circuit 120. As a result, the program voltage is supplied from the voltage generation circuit to the local word line, e.g., WL0, coupled to the selected memory cell, e.g., C01, through the global word line. The pass voltage is supplied from the voltage generation circuit to the local word lines, e.g., WL1~WLn, coupled to unselected memory cells C11~Cn1 through the global word lines. Accordingly, data in the selected memory cell C01 are stored by the program voltage.

Each of the page buffer groups 140 may include the page buffers PB1~PBk coupled to the memory array 110 through the bit lines BL1~BLk. The page buffers PB1~PBk of the page buffer group 140 precharges selectively the bit lines BL1~BLk according to data inputted for storing data in the memory cells C01~C0$k$, or senses a voltage of the bit lines BL1~BLk to read data from the memory cells C01~C0k, based on the PB control signal PBCON of the control circuit 120.

For example, in the event that program data, e.g., '0', is inputted to a page buffer PB1 to store the data in a memory cell C01, the page buffer PB1 supplies a program allowable voltage, e.g., a ground voltage, to the bit line BL1 of the memory cell C01 for storing the program data in the program operation. As a result, a threshold voltage of the memory cell C01 increases by the program voltage supplied to the word line WL0 and the program allowable voltage supplied to the bit line BL1 in the program operation. In the event that an erase data, e.g., "1", is inputted to the page buffer PB1 to store the erase data in the memory cell C01, the page buffer PB1 supplies a program inhibition voltage, e.g., a supply voltage Vcc, to the bit line BL1 of the memory cell C01 for storing the erase data in the program operation. As a result, the threshold voltage of the memory cell C01 does not increase by the program inhibition voltage supplied to the bit line BL1, even when the program voltage is supplied to the word line WL0 in the program operation. Different data may be stored in the memory cell accordingly as the threshold voltage varies.

In the program verification operation, the page buffer group 140 precharges selected bit lines, e.g., BL1~BLk. In the event that a program verification voltage is supplied from the voltage supplying circuit 130 to the selected word line WL0, bit lines of memory cells of which the program operation is completed keep precharge state, and bit lines of memory cells of which a program operation is not completed are discharged. The page buffer group 140 senses voltage change of the bit lines BL1~BLk, and latches a program result of memory cells corresponding to the sensed result.

Detailed circuit configuration of the page buffer will be described below.

The column decoder 150 selects the page buffers PB1~PBk in the page buffer group 150 based on the column address signal CADD outputted from the control circuit 120. That is, the column decoder 150 delivers sequentially data to be stored in the memory cells to the page buffers PB1~PBk based on the column address signal CADD. The column decoder 150 selects sequentially the page buffers PB1~PBk based on the column address CADD, to output the data of the memory cells latched in the page buffer PB1~PBk by the read operation to an external device.

The input/output circuit 160 delivers data to the column decoder 150 according to control of the control circuit 120 to input data provided from an external device to the page buffer group 140. Here, the data is stored in the memory cells in the program operation. In the event that the column decoder 150 delivers the data provided from the input/output circuit 160 to the page buffers PB1~PBk of the page buffer group 140 through the above described method, the page buffers PB1~PBk store the delivered data in an internal latch circuit. The input/output circuit 160 outputs the data provided from the page buffers PB1~PBk of the page buffer group 140 through the column decoder 150 to the external device in the read operation.

Figure 3:
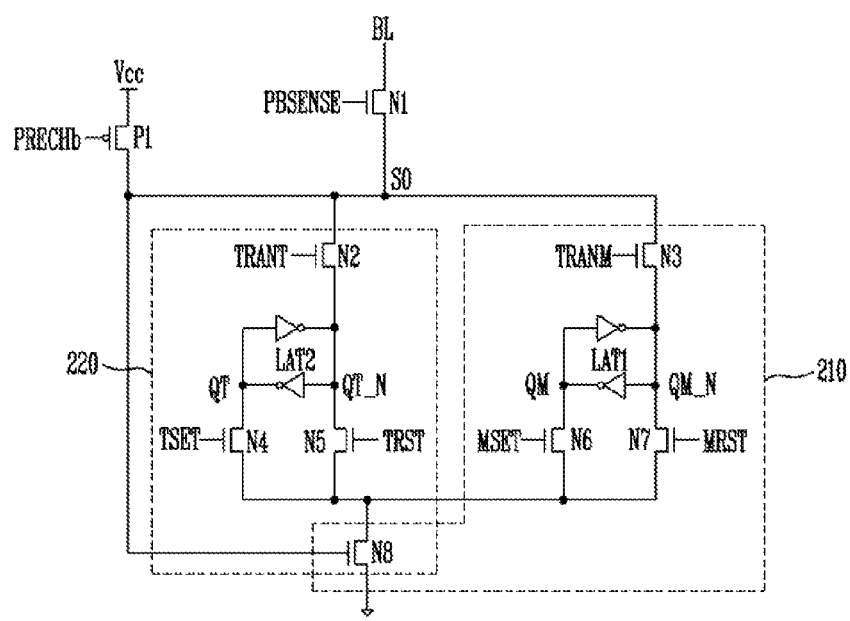
FIG. 3 is a detailed diagram illustrating an example of a page buffer shown in FIG. 1.

FIG. 3 is a circuit diagram illustrating a page buffer according to an embodiment of the present invention.

In FIG. 3, the page buffer operates based on control of the control circuit (120 in FIG. 1), and signals PRECHb, TRANT, TRANM, TRST, TSET, MRST, MSET and PBSENSE may be outputted from the control circuit.

The page buffer may include a bit line coupling circuit N1, a precharge circuit P1 and registers.

The bit line coupling circuit N1 couples the bit line BL to one of the registers based on a coupling signal PBSENSE.

The registers are coupled in parallel to the bit line coupling circuit N1, and a connection node between the bit line coupling circuit N1 and the registers indicates a sensing node SO.

The precharge circuit P1 precharges the sensing node SO based on a precharge signal PRECHb.

The number of the registers may be modified according to design. For example, two registers are shown in FIG. 3.

A main register 210 may supply the program inhibition voltage or the program allowable voltage, e.g., 0V, to the bit line in the program operation. The main register 210 changes initially stored data '0' to '1' or keeps the data '0', according to whether the threshold voltage of the memory cell is greater than the target verification voltage in the program verification operation performed after the program operation is performed.

A sub-register 220 may supply a positive voltage smaller than the program inhibition voltage or the program allowable voltage, e.g., 0V, to the bit line in the program operation. The sub-register 220 changes initially stored data '0' to '1' or keeps the data '0', according to whether the threshold voltage of the memory cell is greater than a sub-verification voltage in the program verification operation performed after the program operation is performed.

The main register 210 and the sub-register 220 include switching elements and a latch.

The main register 210 may include a latch LAT1 for latching data, a switching element N3 for coupling a first node QM_N of the latch LAT1 to the sensing node SO based on a transmission signal TRANM, a switching element N6 coupled to a second node QM and operating based on a set signal MSET, a switching element N7 coupled to the first node QM_N and operating based on a reset signal MRST, and a switching element N8 coupled between the switching elements N6 and N7 and a ground terminal and operating according to potential of the sensing node SO.

The sub-register 220 may include a latch LAT2 for latching data, a switching element N2 for coupling a first node QT_N of the latch LAT2 to the sensing node SO based on a transmission signal TRANT, a switching element N4 coupled to a second node QT and operating based on a set signal TSET, a switching element N5 coupled to the first node QT_N and operating based on a reset signal TRST, and the switching element N8 coupled between the switching elements N4 and N5 and the ground terminal and operating according to the potential of the sensing node SO.

Figure 4:
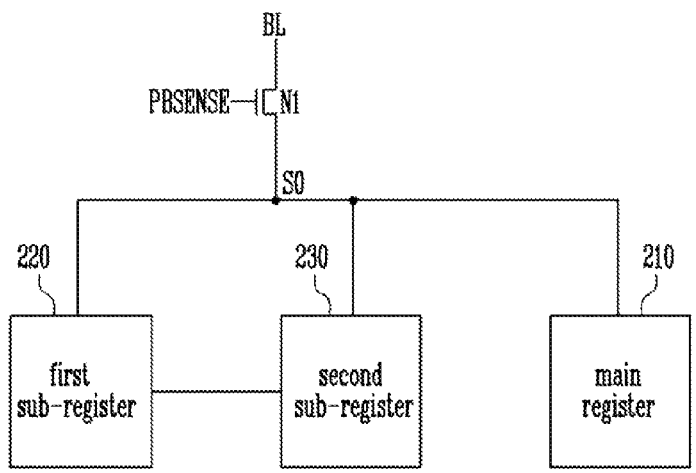
FIG. 4 is a detailed diagram illustrating an example of a page buffer shown in FIG. 1.

FIG. 4 is a block diagram illustrating a page buffer according to an embodiment of the present invention.

In FIG. 4, the page buffer may include a bit line coupling circuit N1, a main register 210, a first sub-register 220, and a second sub-register 230.

Since the bit line coupling circuit N1 is the same as in FIG. 4, any further description concerning the bit line coupling circuit N1 will be omitted.

The first sub-register 220 performs a program verification operation based on a sub-verification voltage, and then supplies a first positive voltage smaller than a program inhibition voltage to a bit line according to data stored in the first sub-register 220, if a threshold voltage of a memory cell is higher than the sub-verification voltage in a first program operation.

The second sub-register 230 supplies a second positive voltage that is higher than the first positive voltage to the bit line in a second program operation after the first program operation, according to data transmitted from the first sub-register 220.

The main register 210 discharges the bit line according to data stored, before the first positive voltage or the second positive voltage to the bit line is supplied to the bit line, if the threshold voltage of the memory cell is smaller than the target verification voltage. The main register 210 supplies the program inhibition voltage to the bit line according to the data stored, before the first positive voltage or the second positive voltage is supplied to the bit line, if the threshold voltage of the memory cell is greater than the target verification voltage.

In an embodiment, the first sub-register 220 may supply the first positive voltage to the bit line, when the second sub-register 230 supplies the second positive voltage to the bit line. Accordingly, drivability of the semiconductor memory device increases, and thus a period taken for precharging the bit line may reduce.

In the event that the page buffer includes two sub-registers 220 and 230 as shown in FIG. 4, the first positive voltage and the second positive voltage may be supplied to the bit line. This provides the same effect as when a step voltage is reduced in the program operation. This will be described below.

In the event that the page buffer includes three sub-registers, a first positive voltage to a third positive voltage may be supplied to the bit line. Here, a third sub-register may have the same circuit configuration and function as those of the second sub-register 230.

Figure 5:
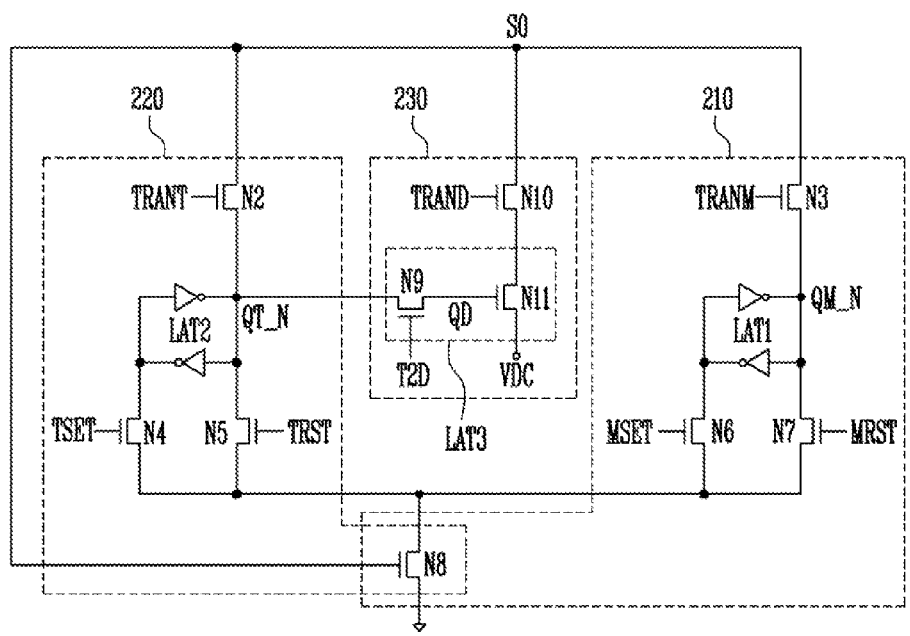
FIG. 5 is detailed diagram illustrating a main register, first and second sub-registers shown in FIG. 4.

FIG. 5 is a circuit diagram illustrating the main register 210, the first sub-register 220 and the second sub-register 230 in FIG. 4.

In FIG. 5, the first sub-register 220 may include a latch LAT2 and a first positive voltage transmission circuit N2.

The latch LAT2 stores data after the program verification operation for the memory cells is performed based on the sub-verification voltage. In the event that the threshold voltage of the memory cell is greater than the sub-verification voltage, the latch LAT2 stores data '1'. In the event that the threshold voltage of the memory cell is smaller than the sub-verification voltage, the latch LAT2 keeps data '0'.

The first positive voltage transmission circuit N2 delivers the first positive voltage to the sensing node SO by adjusting potential determined by data, based on a first positive voltage transmission signal TRANT. In the event that the threshold voltage of the memory cell is greater than the sub-verification voltage, the latch LAT2 stores data '1', and a first node QT_N has a logic high level. The first positive voltage may be provided to the sensing node SO by adjusting voltage level of the first positive voltage transmission signal TRANT.

The second sub-register 230 may include a latch LAT3 and a second positive voltage transmission circuit N10.

The latch LAT3 stores data transmitted from the first sub-register 220 based on a data transmission signal T2D, and delivers an internal voltage VDC inputted from an external device to the second positive voltage transmission circuit N10.

The latch LAT3 may include a first switching circuit N9 for delivering the data transmitted from the first sub-register 220 based on the data transmission signal T2D and a second switching circuit N11 for delivering the internal voltage VDC to the second positive voltage transmission circuit N10 according to the delivered data.

If the threshold voltage of the memory cell is greater than the sub-verification voltage, data '1' is transmitted from the first sub-register 220. The latch LAT3 delivers the internal voltage VDC to the second positive voltage transmission circuit N10 based on the data '1' transmitted from the first sub-register 220.

The second positive transmission circuit N10 delivers the second positive voltage to the sensing node SO by adjusting the delivered internal voltage VDC based on the second positive voltage transmission signal TRAND.

Since the internal voltage VDC is high voltage, the second positive voltage may be delivered to the sensing node SO by adjusting voltage level of the second positive voltage transmission signal TRAND.

Since the second positive voltage is higher than the first positive voltage, the voltage level of the second positive voltage transmission signal TRAND is greater than that of the first positive voltage transmission signal TRANT.

To supply the first positive voltage to the bit line in the program operation when the threshold voltage of the memory cells is greater than the sub-verification voltage and to supply the second positive voltage that is higher than the first positive voltage to the bit line in next program operation, the data transmission signal T2D is inputted after the second positive voltage transmission signal TRAND is inputted.

Circuit configuration of the main register 210 in FIG. 5 is the same as in FIG. 3, and thus any further description concerning the main register 210 will be omitted.

The first sub-register 220 includes the latch LAT2 and the first positive voltage transmission circuit N2 in FIG. 5, but it may further include elements of the sub-register 220 shown in FIG. 3.

Figure 6:
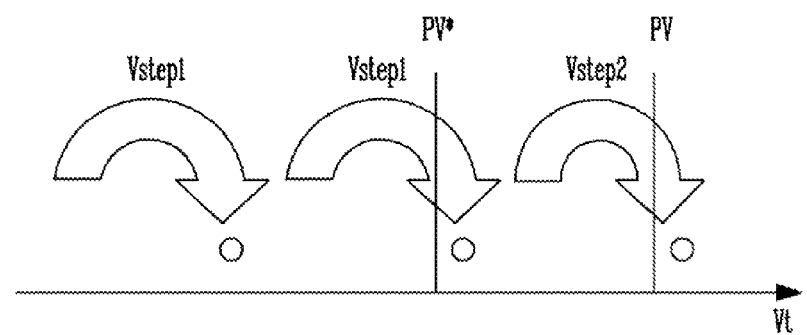
FIG. 6 is a view illustrating a method of operating a semiconductor memory device according to an embodiment of the present invention.

FIG. 6 is a view illustrating a method of operating a semiconductor memory device according to an embodiment of the present invention.

In FIG. 6, according to the method, the semiconductor memory device performs a program loop, including a program operation and a program verification operation based on a sub-verification voltage PV*, which is smaller than the a target verification voltage PV, and the target verification voltage PV, to the memory cells until the threshold voltage of the memory cells is greater than the target verification voltage PV.

In the method, the semiconductor memory device increases a program voltage supplied to the word line by a first step voltage Vstep1 in the program operation, if the threshold voltage of the memory cells is smaller than the sub-verification voltage PV*. If threshold voltage of the memory cells becomes higher than the sub-verification voltage PV*, the semiconductor memory device increases the program voltage supplied to the word line by a second step voltage Vstep2, which is smaller than the first step voltage Vstep1, in the program operation.

Accordingly, a threshold voltage distribution of the memory cells may be narrowed.

Figure 7:
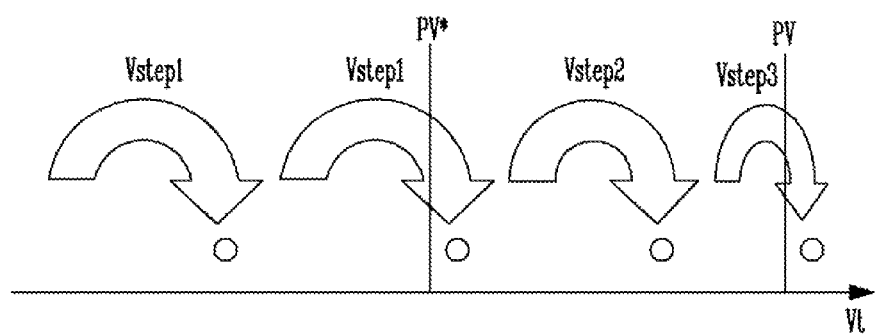
FIG. 7 is a view illustrating a method of operating a semiconductor memory device according to an embodiment of the present invention.

FIG. 7 is a view illustrating a method of operating a semiconductor memory device according to an embodiment of the present invention.

In FIG. 7, according to the method, the semiconductor memory device performs a program loop, including a program operation and a program verification operation based on a sub-verification voltage PV*, which is smaller than a target verification voltage PV, and the target verification voltage PV, to the memory cells until the threshold voltage of the memory cells is greater than the target verification voltage PV.

A memory cell, of which a threshold voltage is smaller than the target verification voltage PV, may still exist even after another program operation may be further performed, if difference between the sub-verification voltage PV* and the target verification voltage PV is large.

If the threshold voltage of the memory cells is smaller than the sub-verification voltage PV*, the semiconductor memory device increases the program voltage supplied to the word line by a first step voltage Vstep1 in the program operation. If the threshold voltage of the memory cells becomes higher than the sub-verification voltage PV*, the semiconductor memory device increases the program voltage supplied to the word line by a second step voltage Vstep2 that is smaller than the first step voltage Vstep1 in next program operation. The semiconductor memory device increases the program voltage supplied to the word line by a third step voltage Vstep3 that is smaller than the second step voltage Vstep2 in next program operation.

Accordingly, a threshold voltage distribution of the memory cells may be further narrowed even when the difference between the sub-verification voltage PV* and the target verification voltage PV is large.

Figure 8:
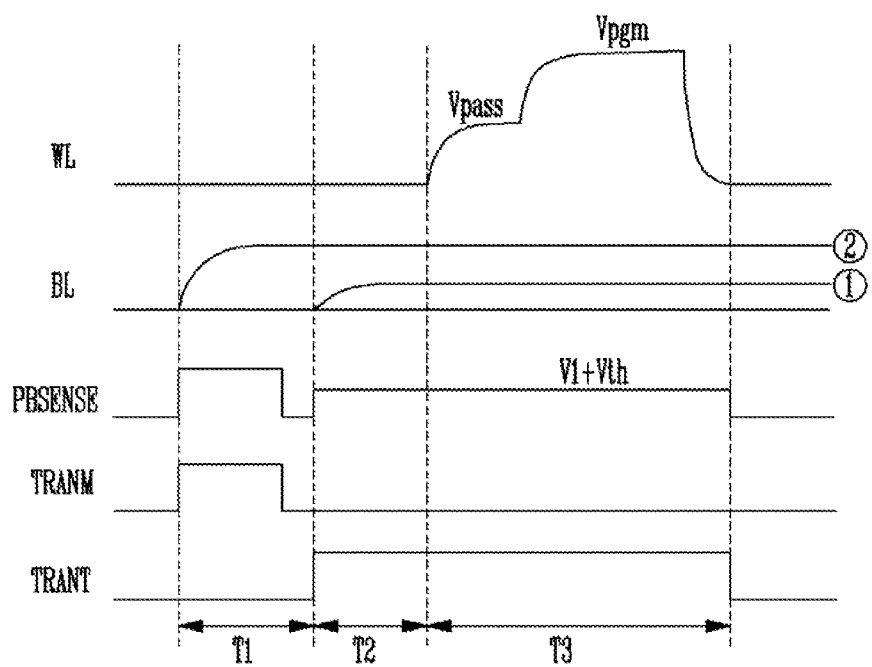
FIG. 8 is a view illustrating operation waveform in a semiconductor memory device according to an embodiment of the present invention.

FIG. 8 is a view illustrating operation waveform in a semiconductor memory device according to an embodiment of the present invention.

Referring to FIG. 8, the operation method may include a step of performing a program loop, including a program operation and a program verification operation based on a sub-verification voltage, which is smaller than a target verification voltage, and the target verification voltage, to the memory cells until the threshold voltage of the memory cells is greater than the target verification voltage. The semiconductor memory device supplies a positive voltage smaller than the program inhibition voltage to the bit line of the memory cell, of which a threshold voltage is higher than the sub-verification voltage and is smaller than the target verification voltage, in the program operation. The semiconductor memory device increases the positive voltage whenever the program operation is performed after the threshold voltage of the memory cell becomes higher than the sub-verification voltage.

In FIG. 8, the program operation includes periods T1 and T2 for setting up the bit line and a period T3 for increasing the threshold voltage of the memory cell by supplying a program voltage Vpgm to the word line.

Data is stored in the latches of the main register 210 and the sub-register 220 according to the threshold voltage of each of the memory cells, if the previous program verification operation is performed based on the sub-verification voltage and the target verification voltage.

The data transmission signal TRANM of the main register 210 and the bit line coupling signal PBSENSE are inputted at a logic high level, e.g., a supply voltage Vcc, in the period T1. The program inhibition voltage is supplied to the bit line of the memory cell, of which the threshold voltage is greater than the target verification voltage, according to data '1' stored in the main register 210, which is denoted with ②. The program allowable voltage, e.g., 0V, is supplied to the bit line of the memory cell, of which the threshold voltage is smaller than the target verification voltage, according to data '0' stored in the main register 210, and so the bit line is discharged.

The data transmission signal TRANT of the sub-register 220 is inputted at a logic high level and the bit line coupling signal PBSENSE is inputted at a voltage level, e.g., V1+Vth (where Vth is a threshold voltage of an NMOS transistor), corresponding to a first positive voltage V1, in the period T2. The first positive voltage is supplied to the bit line of the memory cell, of which the threshold voltage is greater than the sub-verification voltage, according to data '1' stored in the sub-register 220, which is denoted with ①. The program allowable voltage, e.g., 0V, is supplied to the bit line of the memory cell, of which the threshold voltage is smaller than the target verification voltage, according to data '0' stored in the sub-register 220, and so the bit line keeps the discharge state.

The semiconductor memory device supplies the program voltage Vpgm to a word line WL selected for the program operation in the period T3. The semiconductor memory device may supply a pass voltage Vpass supplied to unselected word lines to the selected word line WL, and then it may supply the program voltage Vpgm to the selected word line WL. The threshold voltage of the memory cell increases due to difference between the program voltage Vpgm and a voltage of the bit line. The greater difference between the program voltage Vpgm and the voltage of the bit line increases, the more the threshold voltage of the memory cell increases. Accordingly, increase level of the threshold voltage of the memory cell may be adjusted by controlling the voltage of the bit line, thereby narrowing the threshold voltage distribution of the memory cells.

The bit line coupling signal PBSENSE may be inputted at the voltage level V2+Vth after the bit line coupling signal PBSENSE is inputted at the voltage level V1+Vth, in next program operation. As a result, the second positive voltage V2 that is higher than the first positive voltage V1 may be supplied to the bit line in next program operation, and so the threshold voltage distribution of the memory cell may be further narrowed.

Figure 9:
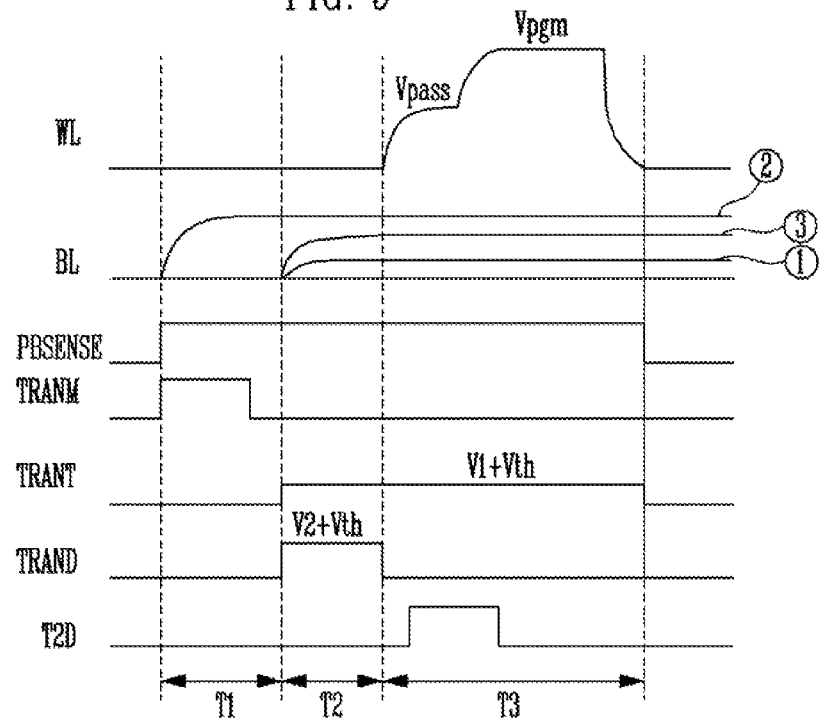
FIG. 9 is a view illustrating operation waveform in a semiconductor memory device according to an embodiment of the present invention.

FIG. 9 is a view illustrating operation waveform in a semiconductor memory device according to an embodiment of the present invention.

In FIG. 9, the program operation may include periods T1 and T2 for setting up the bit line and a period T3 for increasing the threshold voltage of the memory cell by supplying the program voltage Vpgm to the word line.

Data is stored in the latches of the main register 210 and the first and the second sub-registers 220 and 230 according to the threshold voltage of each of the memory cells, in the event that previous program verification operation is performed based on the sub-verification voltage and the target verification voltage.

The data transmission signal TRANM and the bit line coupling signal PBSENSE of the main register 210 are inputted at a logic high level, e.g., a supply voltage Vcc, in the period T1. The program Inhibition voltage is supplied to a bit line of a memory cell of which a threshold voltage is greater than the target verification voltage, according to data '1' stored in the main register 210, which is denoted with ②. The program allowable voltage, e.g., 0V, is supplied to a bit line of a memory cell of which a threshold voltage is smaller than the target verification voltage, according to data '0' stored in the main register 210, and thus the bit line is discharged.

A first positive voltage transmission signal TRANT of the first sub-register 220 is inputted at a voltage level, e.g., V1+Vth (where Vth is a threshold voltage of an NMOS transistor), corresponding to a first positive voltage V1 and a second positive voltage transmission signal TRAND of the second sub-register 230 is inputted at a voltage level, e.g., V2+Vth, corresponding to a second positive voltage V2, in the period T2. The first positive voltage V1 is supplied to the bit line of a memory cell of which the threshold voltage is greater than the sub-verification voltage, according to data '1' stored in the first sub-register 220, which is denoted with ①. The program allowable voltage, e.g., 0V, is supplied to the bit line of the memory cell of which the target voltage is smaller than the target verification voltage, according to data '0' stored in the first sub-register 220, and thus the bit line keeps discharge state.

The data transmission signal T2D is not inputted while the second positive voltage transmission signal TRAND is inputted, when the threshold voltage of the memory cell is greater than the sub-verification voltage for the first time. Since the data '1' is not transmitted to the latch of the second sub-register 230, the latch of the second sub-register 230 stores previous data '0', and the second positive voltage V2 is not delivered to the bit line even when the second positive voltage transmission signal TRAND is inputted.

In the period T3, the program voltage Vpgm is supplied to the selected word line WL for the program operation. In the period T3, the data transmission signal T2D of the second sub-register 230 is inputted, data '1' is transmitted to the latch of the second sub-register 230, and the latch stores the data '1'. Accordingly, if the second positive voltage transmission signal TRAND of the second sub-register 230 is inputted at the voltage level V2+Vth in next program operation, the second positive voltage V2 that is higher than the first positive voltage V1 is supplied to the bit line, which is denoted with ③.

Accordingly, the semiconductor memory device may increase the voltage of the bit line whenever the program operation is performed after the threshold voltage of the memory cell is greater than the sub-verification voltage, thereby narrowing the threshold voltage distribution of the memory cells.

Since the first positive voltage transmission signal TRANT of the first sub-register 220 and the second positive voltage transmission signal TRAND of the second sub-register 230 are simultaneously inputted in the period T2, drivability of the semiconductor memory device may be enhanced, and thus a period taken for precharging the bit line may reduce.

The data '1' stored in the latch of the second sub-register 230 is transmitted to a latch of a third sub-register after a third positive voltage transmission signal of the third register is inputted in next program operation, and a third positive voltage that is higher than the second positive voltage may be supplied to the bit line when the third positive voltage transmission signal of the third sub-register is inputted at a level of the third positive voltage in next program operation. Accordingly, the threshold voltage distribution of the memory cells may be further narrowed by supplying the third positive voltage that is higher than the second positive voltage V2 to the bit line in next program operation.

Figure 10:
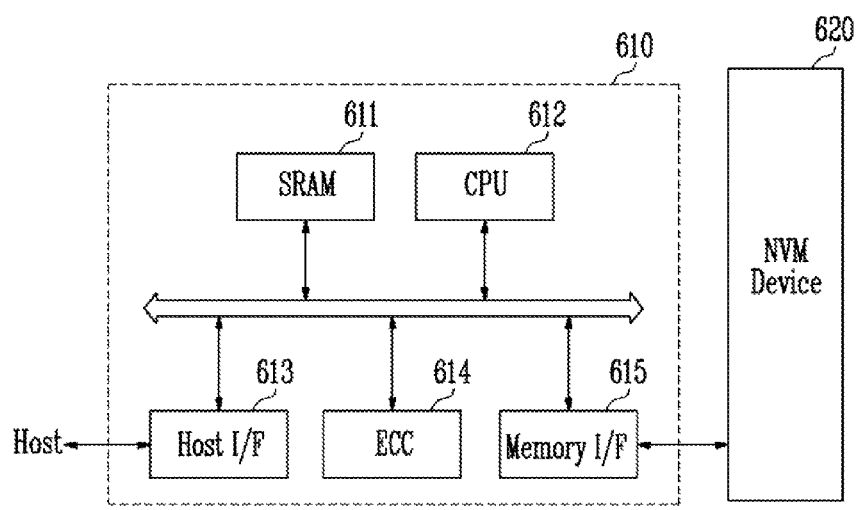
FIG. 10 is a block diagram illustrating a memory system including a non-volatile memory device according to the embodiment of the present invention.

FIG. 10 is a block diagram illustrating a memory system including a non-volatile memory device according to the embodiment of the present invention.

In FIG. 10, the memory system 600 includes a non-volatile memory device (NVM device) 620 and a memory controller 610.

The non-volatile memory device 620 may be the semiconductor memory device described above and operate in accordance with the above method, for compatibility with the memory controller 610. The memory controller 610 controls the non-volatile memory device 620. The memory system 600 may be used as a memory card or a solid-state disk (SSD) by combination of the non-volatile memory device 620 and the memory controller 610. An SRAM 611 is used as an operation memory of a processing unit 612. A host interface 613 has data exchange protocol of a host accessed to the memory system 600. An error correction block 614 detects and corrects error of data read from the non-volatile memory device 620. A memory interface 615 interfaces with the non-volatile memory device 620 of the present invention. The processing unit 612 performs control operation for data exchange of the memory controller 610.

The memory system 600 of the present invention may further include a ROM (not shown) for storing code data for interfacing with the host and so on. The non-volatile memory device 620 may be provided as multi-chip package including flash memory chips. The memory system 600 of the present invention may be provided as highly reliable storage medium having low error possibility. Specially, the flash memory device of the present invention may be included in the SSD that is actively studied. In this case, the memory controller 610 communicates with an external device, e.g., host, through one of various interface protocols such as a universal serial bus (USB), a multi-media card (MMC), a peripheral component interconnection (PCI), a PCI-express (PCI-E), a parallel advanced technology attachment (PATA), a serial ATA (SATA), an small computer system interface (SCSI), an enhanced small device interface (ESDI), an integrated drive electronics (IDE), or the like.

Figure 11:
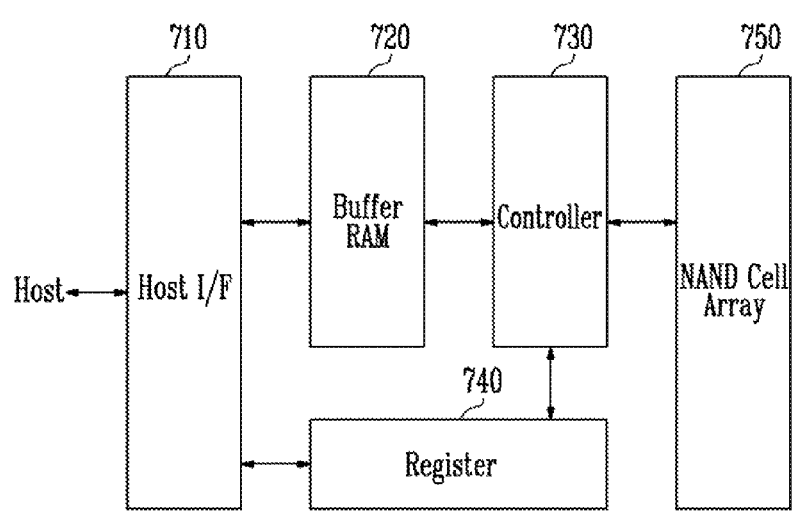
FIG. 11 is a block diagram illustrating a fusion memory device or a fusion memory system for performing an operation in accordance with the embodiment of the present invention.

FIG. 11 is a block diagram illustrating a fusion memory device or a fusion memory system for performing an operation in accordance with the embodiment of the present invention. For example, features of the embodiment of the present invention may be applied to an OneNAND flash memory device 700 as a fusion memory device.

The OneNAND flash memory device 700 includes a host interface 710 for exchanging information with a device using different protocol, a buffer RAM 720 for embedding code for driving the memory device or storing temporarily data, a controller 730 for controlling reading, programming and every state based on a control signal and a command inputted from an outside device, a register 740 for storing data such as configuration for defining command, address, system operation environment in the memory device, and a NAND cell array 750 having operation circuit including a non-volatile memory cell and a page buffer. The OneNAND flash memory device programs data through common program method based on a write command provided from a host.

Figure 12:
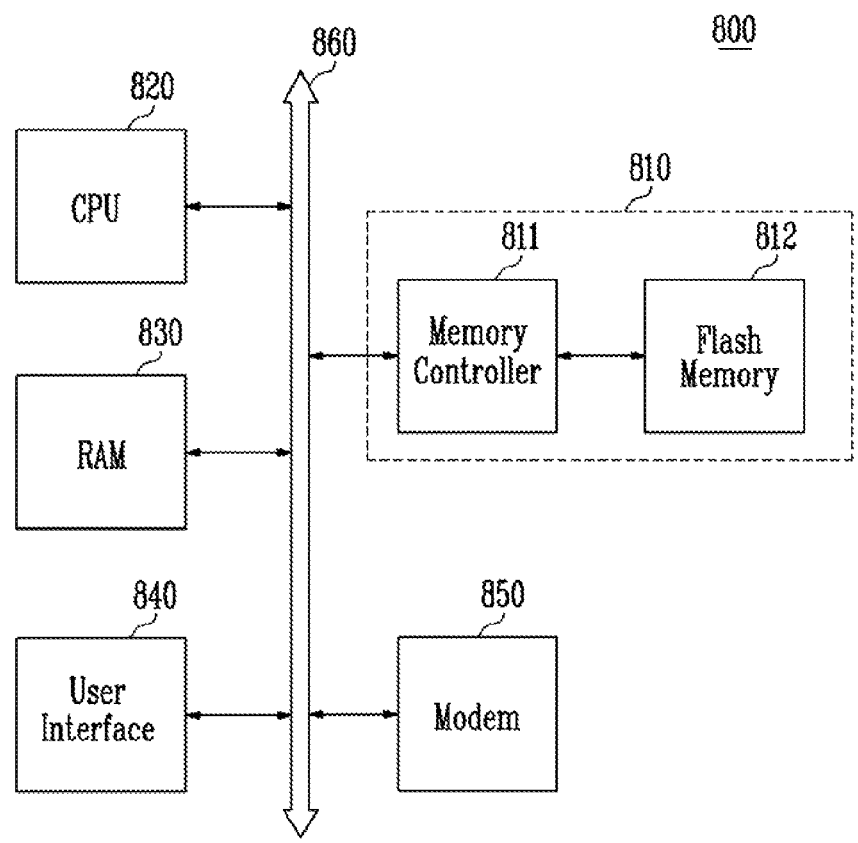
FIG. 12 is a view illustrating a computing system including a flash memory device for performing an operation according to the embodiment of the present invention.

FIG. 12 is a view illustrating a computing system including a flash memory device for performing an operation according to the embodiment of the present invention.

The computing system 800 of the present invention includes a microprocessor (CPU) 820 connected electrically to a system bus 860, a RAM 830, a user interface 840, a modem 850 such as a baseband chipset, and a memory system 810. In the event that the computing system 800 is a mobile device, a battery (not shown) for supplying an operation voltage to the computing system 800 may be further provided. The computing system 800 of the present invention may further include an application chipset, a camera image processor (CIP), a mobile DRAM, etc., which are shown. The memory system 810 may include an SSD using, for example, a non-volatile memory, for storing data. The memory system 810 may be applied to a fusion flash memory, e.g., OneNAND flash memory. The memory system 810 may include a memory controller and a flash memory 812.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A semiconductor memory device comprising:
   memory cells; and
   a peripheral circuit suitable for performing a program loop, including a program operation and a program verification operation based on a sub-verification voltage, which is smaller than a target verification voltage, and the target verification voltage, to the memory cells until a threshold voltage of the memory cells is greater than the target verification voltage,
   wherein the peripheral circuit increases a positive voltage, supplied to a bit line of a memory cell of which a threshold voltage is higher than the sub-verification voltage, whenever the program operation is performed.

2. The semiconductor memory device of claim 1, wherein the peripheral circuit includes page buffers coupled to the bit line, and
each of the page buffers includes:
a first sub-register suitable for supplying a first positive voltage to the bit line according to stored data if the threshold voltage of the memory cell is higher than the sub-verification voltage, in a first program operation; and
a second sub-register suitable for supplying a second positive voltage that is higher than the first positive voltage to the bit line according to the data transmitted from the first sub-register, in a second program operation performed after the first program operation.

3. The semiconductor memory device of claim 2, wherein the second sub-register includes:
a latch suitable for storing the data based on a data transmission signal and for delivering inputted internal voltage based on the data; and
a second positive voltage transmission circuit suitable for delivering the second positive voltage to the bit line by adjusting the delivered internal voltage based on a second positive voltage transmission signal.

4. The semiconductor memory device of claim 3, wherein the data transmission signal is inputted after the second positive voltage transmission signal is inputted.

5. The semiconductor memory device of claim 3, wherein the latch includes:
a first switching circuit suitable for delivering the data based on the data transmission signal; and
a second switching circuit suitable for delivering the internal voltage to the second positive voltage transmission circuit according to the delivered data.

6. The semiconductor memory device of claim 3, wherein the first sub-register includes:
a latch suitable for storing the data; and
a first positive voltage transmission circuit suitable for delivering the first positive voltage to the bit line by adjusting potential determined by the data, based on a first positive voltage transmission signal,
and wherein a level of the first positive voltage transmission signal is smaller than a level of the second positive voltage transmission signal.

7. The semiconductor memory device of claim 2, wherein the first sub-register supplies the first positive voltage to the bit line when the second sub-register supplies the second positive voltage to the bit line.

8. The semiconductor memory device of claim 2, wherein the page buffer further includes:
a main register suitable for discharging the bit line according to data stored before the first positive voltage or the second positive voltage is supplied to the bit line, if the threshold voltage of the memory cell is smaller than the target verification voltage.

9. The semiconductor memory device of claim 1, wherein the page buffer includes page buffers coupled to the bit line, and
each of the page buffers includes:
a first sub-register suitable for supplying a first positive voltage to the bit line according to data changed when the threshold voltage of the memory cell reaches the sub-verification voltage, in a first program operation;
a second sub-register suitable for supplying a second positive voltage that is higher than the first positive voltage to the bit line according to the data, in a second program operation performed after the first program operation; and
a third sub-register suitable for supplying a third positive voltage that is higher than the second positive voltage to the bit line according to the data, in a third program operation performed after the second program operation.

10. A method of operating a semiconductor memory device, the method comprising:
performing a program loop, including a program operation and a program verification operation based on a sub-verification voltage, which is smaller than a target verification voltage, and the target verification voltage, to the memory cells until a threshold voltage of the memory cells is greater than the target verification voltage,
wherein a positive voltage that is smaller than a program inhibition voltage is supplied to a bit line of a memory cell of which a threshold voltage is higher than the sub-verification voltage and is smaller than the target verification voltage, in the program operation, and
the positive voltage is increased whenever the program operation is performed, after the threshold voltage of the memory cell is higher than the sub-verification voltage.

11. The method of claim 10, wherein the increasing of the positive voltage when the program operation is performed includes:
supplying a first positive voltage to the bit line according to data stored in a first sub-register coupled to the bit line in a first program operation, if the threshold voltage of the memory cell is higher than the sub-verification voltage; and
supplying a second positive voltage that is higher than the first positive voltage to the bit line according to data transmitted from the first sub-register to a second sub-register coupled to the bit line, in a second program operation performed after the first program operation.

12. The method of claim 11, wherein the supplying of the first positive voltage includes:
generating the first positive voltage by adjusting potential determined by the data based on a first positive voltage transmission signal.

13. The method of claim 11, wherein the supplying of the second positive voltage to the bit line includes:
generating the second positive voltage by adjusting potential determined by the data based on a second positive voltage transmission signal, a level of the second positive voltage transmission signal being higher than a level of the first positive voltage transmission signal.

14. The method of claim 13, wherein transmission of the data from the first sub-register to the second sub-register is performed after the second positive voltage transmission signal is inputted.

15. The method of claim 11, wherein supplying of the first positive voltage by the first sub-register and supplying of the second positive voltage by the second sub-register are simultaneously performed.

16. The method of claim 11, wherein the increasing of the positive voltage further includes:
discharging the bit line according to data stored in a main register coupled to the bit line before the first positive voltage or the second positive voltage is supplied to the bit line, if the threshold voltage of the memory cell is smaller than the target verification voltage.

17. The method of claim 10, wherein the increasing of the positive voltage includes:

supplying a first positive voltage to the bit line according to data stored in a first sub-register coupled to the bit line in a first program operation, if the threshold voltage of the memory cell is higher than the sub-verification voltage;

supplying a second positive voltage that is higher than the first positive voltage to the bit line according to data transmitted from the first sub-register to a second sub-register coupled to the bit line, in a second program operation performed after the first program operation; and supplying a third positive voltage that is higher than the second positive voltage to the bit line according to data from the second sub-register to a third sub-register coupled to the bit line, in a third program operation performed after the second program operation.

* * * * *